(12) United States Patent
Xu

(10) Patent No.: US 9,329,445 B2
(45) Date of Patent: May 3, 2016

(54) MASK PLATE AND PROCESSES FOR MANUFACTURING ULTRAVIOLET MASK PLATE AND ARRAY SUBSTRATE

(71) Applicant: SHENZHEN CHINA STAR OPTOELECTRONICS TECHNOLOGY CO., LTD., Shenzhen (CN)

(72) Inventor: Xiangyang Xu, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/416,784

(22) PCT Filed: Jun. 26, 2014

(86) PCT No.: PCT/CN2014/080822
§ 371 (c)(1),
(2) Date: Jan. 23, 2015

(87) PCT Pub. No.: WO2015/188402
PCT Pub. Date: Dec. 17, 2015

(65) Prior Publication Data
US 2016/0041417 A1    Feb. 11, 2016

(51) Int. Cl.
*G03F 1/50* (2012.01)
*G03F 1/80* (2012.01)
(Continued)

(52) U.S. Cl.
CPC .......... *G02F 1/13439* (2013.01); *G02F 1/1333* (2013.01); *G02F 1/1339* (2013.01);
(Continued)

(58) Field of Classification Search
CPC ............... G03F 1/50; G03F 1/76; G03F 1/80; G03F 7/20; G03F 7/2002; G02F 1/13439; G02F 1/136286; G02F 2001/136295; G02F 1/1333; G02F 1/1339; H01L 21/32139; H01L 21/283; H01L 21/28008
USPC ............. 430/5, 318, 319, 321, 323, 326, 396; 349/153, 190
See application file for complete search history.

(56) References Cited

U.S. PATENT DOCUMENTS

2004/0048405 A1*  3/2004  Hirota ............... G02F 1/134363
                                                    438/29
2013/0342803 A1* 12/2013  Chiu ..................... G02F 1/1341
                                                   349/190
(Continued)

FOREIGN PATENT DOCUMENTS

CN         103337522 A      10/2013
CN         203224698 U      10/2013
(Continued)

OTHER PUBLICATIONS

International Search Report and Written Opinion of the International Searching Authority (Forms PCT/ISA/237, PCT/ISA/210 and PCT/ISA/220) issued on Feb. 27, 2015, by the State Intellectual Property Office of China in corresponding International Application No. PCT/CN2014/080822. (12 pages).

*Primary Examiner* — John A McPherson
(74) *Attorney, Agent, or Firm* — Buchanan Ingersoll & Rooney PC

(57) ABSTRACT

The present disclosure discloses a mask plate and processes for manufacturing an ultraviolet mask plate and an array substrate. The present disclosure relates to the field of display technology and can reduce costs for manufacturing ultraviolent mask plates. The mask plate comprises a transparent area, a semi-transparent area, and a non-transparent area, wherein the transparent area and the non-transparent area correspond to a frame glue area and a layer pattern area of a liquid crystal display panel, respectively, and other regions of the mask plate constitute said semi-transparent area. The present disclosure can be used in the manufacture of display devices of liquid crystal display televisions, liquid crystal displays, mobile phones, tablet computers, etc.

9 Claims, 3 Drawing Sheets

(51) Int. Cl.
*G02F 1/1333* (2006.01)
*G02F 1/1343* (2006.01)
*H01L 21/3213* (2006.01)
*H01L 21/283* (2006.01)
*H01L 21/28* (2006.01)
*G03F 1/76* (2012.01)
*G02F 1/1362* (2006.01)
*G02F 1/1339* (2006.01)
*G03F 7/20* (2006.01)

(52) U.S. Cl.
CPC ............ *G02F1/136286* (2013.01); *G03F 1/50* (2013.01); *G03F 1/76* (2013.01); *G03F 1/80* (2013.01); *G03F 7/2002* (2013.01); *H01L 21/283* (2013.01); *H01L 21/28008* (2013.01); *H01L 21/32139* (2013.01); *G02F 2001/136295* (2013.01)

(56) References Cited

U.S. PATENT DOCUMENTS

| | | | |
|---|---|---|---|
| 2013/0344767 A1* | 12/2013 | Chiu | G02F 1/133788 445/25 |
| 2015/0002803 A1* | 1/2015 | Qin | G02F 1/1339 349/190 |
| 2015/0129881 A1 | 5/2015 | Kong et al. | |
| 2015/0277226 A1* | 10/2015 | Liu | G03F 1/38 216/23 |

FOREIGN PATENT DOCUMENTS

| | | |
|---|---|---|
| CN | 103454815 A | 12/2013 |
| CN | 103456740 A | 12/2013 |
| KR | 100919184 B1 | 9/2009 |

* cited by examiner

A mask plate and processes for manufacturing ultraviolet mask plate and array substrate

MASK PLATE AND PROCESSES FOR MANUFACTURING ULTRAVIOLET MASK PLATE AND ARRAY SUBSTRATE

The present application claims benefit of Chinese Patent application CN 201410255565.4 entitled "Mask plate and processes for manufacturing ultraviolet mask plate and array substrate" and filed on Jun. 10, 2014, which is incorporated herein by reference.

FIELD OF THE INVENTION

The present disclosure relates to the field of display technology, in particular to a mask plate, a process for manufacturing an ultraviolet mask plate, and a process for manufacturing an array substrate.

BACKGROUND OF THE INVENTION

With development of display technology, liquid crystal displays have become most commonly used display devices.

In the process of manufacturing a liquid crystal display, the cell process, as an important procedure, comprises not only aligning and then assembling an array substrate and a color filter substrate, but also irradiating the frame glue filled between the array substrate and the color filter substrate by using ultraviolet light so as to solidify the glue. Since the electrical performance of the thin film transistor (TFT) provided on the array substrate will be affected after ultraviolet irradiation, those parts where the TFT and the like are located should be covered with an ultraviolet mask plate during the irradiation, but leaving the frame glue exposed.

An existing ultraviolet mask plate, comprising a glass substrate and a layer of shielding metal formed on the glass substrate, is also prepared by using a mask plate through a patterning process. Since the ultraviolet mask plate can be reused, the usage rate of the mask plate for manufacturing the ultraviolet mask plate is rather low. Hence, the cost of manufacturing the ultraviolet mask plate is relatively high in the prior art.

SUMMARY OF THE INVENTION

The present disclosure aims to provide a mask plate and processes for manufacturing an ultraviolet mask plate and an array substrate using the same, so as to reduce costs for manufacture of ultraviolet mask plates.

The present disclosure provides a mask plate, comprising a transparent area, a semi-transparent area, and a non-transparent area; the transparent area and the non-transparent area correspond to a frame glue area and a layer pattern area of a liquid crystal display panel, respectively, and other regions of the mask plate constitute said semi-transparent area.

Preferably, the transmittance of the semi-transparent area ranges from ½ to ⅔.

The layer pattern is in the form of a pattern of gate metal layer, and the source/drain metal layer pattern and a transparent electrode layer pattern of said liquid crystal panel are located in the semi-transparent area.

Alternatively, the layer pattern is in the form of a source/drain metal layer pattern, and the gate metal layer pattern and transparent electrode layer pattern of said liquid crystal panel are located in the semi-transparent area.

Alternatively, the layer pattern is in the form of a transparent electrode layer pattern, and the gate metal layer pattern and source/drain metal layer pattern of said liquid crystal panel are located in said semi-transparent area.

The present disclosure further provides a process for manufacturing an ultraviolet mask plate, comprising the steps of:

forming a metal layer on a base substrate;
coating a photoresist layer on the metal layer;
exposing said photoresist layer with a first illumination intensity through the above mask plate;
removing the photoresist at the area corresponding to the transparent area of the mask plate;
etching said metal layer; and
removing the remaining photoresist.

The present disclosure further provides a process for manufacturing an array substrate, comprising:

forming a material layer to be etched on a base substrate;
coating a photoresist layer on the material to be etched;
exposing said photoresist layer with a second illumination intensity through the above mask plate;
removing the photoresist corresponding to the transparent area and semi-transparent area of the mask plate;
etching said material to be etched to form a layer pattern; and
removing the remaining photoresist.

Preferably, the material layer to be etched is a metal layer, and the layer pattern is in the form of a gate metal layer pattern or a source/drain metal layer pattern.

Alternatively, the material layer to be etched is a transparent electrode layer, and the layer pattern is a transparent electrode layer pattern.

The present disclosure brings about the following advantageous effects. In the mask plate provided by the present disclosure, the transparent area corresponds to the frame glue area of the liquid crystal display pane, i.e., the areas other than a metal shielding layer on the ultraviolet mask plate, while the semi-transparent area and non-transparent area jointly correspond to the metal shielding layer on the ultraviolet mask plate. When the mask plate is used for manufacturing an ultraviolet mask plate, the photoresist can be exposed with a first illumination intensity which is relatively low, so as to be completely removed in the transparent area, partially removed in the semi-transparent area, and remain in the non-transparent area. The ultraviolet mask plate can be formed after an etching process.

On the other hand, in the mask plate provided by the present disclosure, the non-transparent area corresponds to the layer pattern area of the liquid crystal display panel. When the mask plate is used for manufacturing corresponding layer pattern (such as a gate metal layer pattern) on the array substrate, the photoresist can be exposed with a second illumination intensity which is relatively high, so as to be completely removed in the transparent area and the semi-transparent area, and remain in the non-transparent area. The corresponding layer pattern can be formed after an etching process.

Therefore, the mask plate provided in the present disclosure can be used for manufacturing both an ultraviolet mask plate and an array substrate, so that one single mask plate can be both used in the process of manufacturing the ultraviolet mask plate and in the process of manufacturing the array substrate. As such, no separate mask plate is required for manufacturing the ultraviolet mask plate, thus reducing costs thereof.

Other features and advantages of the present disclosure will be illustrated and become partially obvious in the following description, or can be understood through implementation of the present disclosure. The purposes and other advantages of the present disclosure will be achievable and obtainable through the structures as indicated in the following description, claims, and drawings.

BRIEF DESCRIPTION OF THE DRAWINGS

In order to explicitly illustrate the technical solution of the embodiments of the present disclosure, the embodiments will be described in combination with drawings, in which.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It is important to note that as long as there is no structural conflict, all the technical features mentioned in all the embodiments may be combined together in any manner, and the technical solutions obtained in this manner all fall within the scope of the present disclosure.

Embodiment 1

Figure 1:
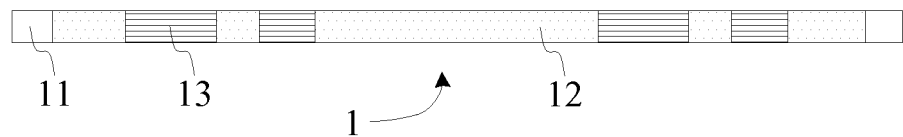
FIG. 1 is a schematic diagram of a mask plate provided in Embodiment 1 of the present disclosure.

As illustrated in FIG. 1, this embodiment of the present disclosure provides a mask plate 1 comprising a transparent area 11, a semi-transparent area 12, and a non-transparent area 13. The transparent area 11 and the non-transparent area 13 correspond to a frame glue area and a layer pattern area of a liquid crystal display panel, respectively, and other regions of the mask plate 1 constitute said semi-transparent area 12.

The mask plate provided in this embodiment can be used for manufacturing both an ultraviolet mask plate and an array substrate, thus achieving sharing of one mask plate in the manufacturing processes of the ultraviolet mask plate and the array substrate. As such, no separate mask plate is required for manufacturing the ultraviolet mask plate, thus reducing costs thereof.

Embodiment 2

This embodiment of the present disclosure provides a process for manufacturing an ultraviolet mask plate, wherein the mask plate of Embodiment 1 is used.

As illustrated in FIGS. 2a to 2d, the process comprises the following steps.

In step S11, a metal layer 3 is formed on a base substrate 2.

Specifically, by using a conventional deposition process, the metal layer 3 can be deposited on the base substrate 2 made of glass.

In step S12, a photoresist layer 4 is coated on the metal layer 3.

Specifically, by using a conventional coating process, the photoresist layer 4 can be coated on the metal layer 3.

Figure 2A:
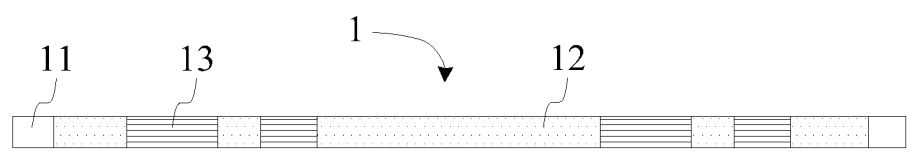
FIGS. 2a to 2d schematically show a process for manufacturing an ultraviolet mask plate as provided in Embodiment 2 of the present disclosure.

In step S13, as indicated in FIG. 2a, the photoresist layer 4 is exposed with a first illumination intensity through the mask plate 1 of Embodiment 1.

As a preferred embodiment, the transmittance of the semi-transparent area of the mask plate 1 ranges from ½ to ⅔. The photoresist layer 4 is exposed with the first illumination intensity through the mask plate 1 of Embodiment 1, so that the photoresist layer 4 in the semi-transparent area 12 would not be completely removed in subsequent step S14.

Figure 2B:
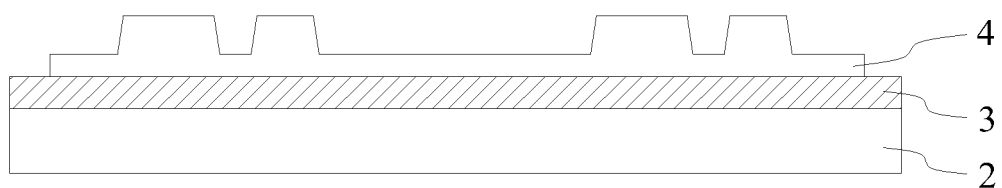

In step S14, and as indicated in FIG. 2b, the photoresist layer 4 on the area corresponding to the transparent area 11 of the mask plate 1 is removed.

Specifically, an ashing process can be used to remove the exposed photoresist layer 4, wherein the photoresist layer 4 in the transparent area 11 is completely removed. Since the photoresist layer 4 is exposed with the first illumination intensity which is relatively low in S13, it could only be partially removed in the semi-transparent area 12, while the photoresist 4 in the non-transparent area 13 completely remains.

Figure 2C:
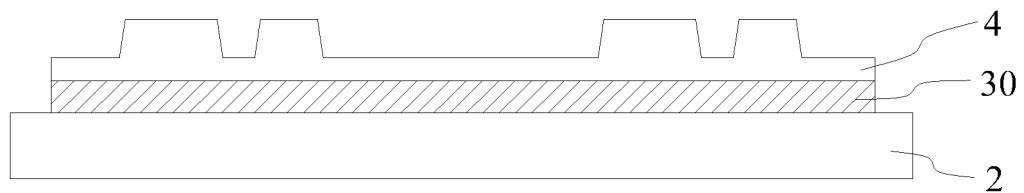

In S15, as indicated in FIG. 2c, the metal layer 3 is etched.

Specifically, a wet etching process can be performed to the metal layer 3. Since the photoresist layer 4 still covers the metal layer 3 in the semi-transparent area 12 and the non-transparent area 13, the metal layer 3 can only be etched away in the transparent layer 11 (corresponding to the frame glue area of the liquid crystal display panel), and remain in the semi-transparent area 12 and the non-transparent area 13. As such, a metal barrier layer 30 is formed on the ultraviolet mask plate.

Figure 2D:
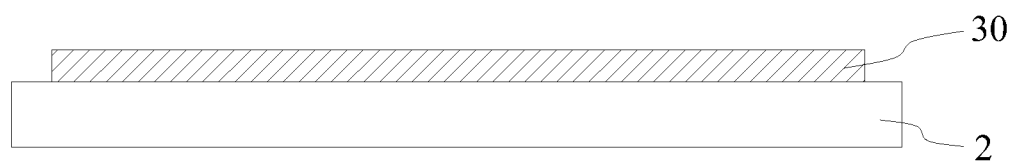

In S16, as indicated in FIG. 2d, the remaining photoresist layer 4 is removed.

Through a wet striping process, the remaining photoresist layer 4 in the semi-transparent area 12 and the non-transparent area 13 is removed, and thus the ultraviolet mask plate can be made.

Embodiment 3

This embodiment of the present disclosure provides a process for manufacturing an array substrate using the mask plate of Embodiment 1. The non-transparent area of the mask plate corresponds to a layer pattern area of a liquid crystal display panel. The layer pattern can be in the form of a gate metal layer pattern, a source/drain metal layer pattern, or a transparent electrode layer pattern. In this embodiment, the layer pattern is in the form of a gate metal layer pattern, i.e., the gate metal layer pattern of the array substrate is formed by using the mask plate, while the source/drain metal layer pattern and the transparent electrode layer pattern of the liquid crystal display panel are located in the semi-transparent area of the mask plate.

As indicated in FIGS. 3a to 3d, the process comprises the following steps.

In step S21, a material layer to be etched is formed on a base substrate 2.

Since this embodiment employs the mask plate 1 of Embodiment 1 to form a gate metal layer pattern, the material layer to be etched in this embodiment is in the form of a gate metal layer 5. A deposition process can be performed in this step to deposit the gate metal layer 5 on the base substrate 2.

In step S22, a photoresist layer 4 is coated on the gate metal layer 5.

Specifically, through a normal coating process, the photoresist layer 4 can be coated on the gate metal layer 5.

Figure 3A:
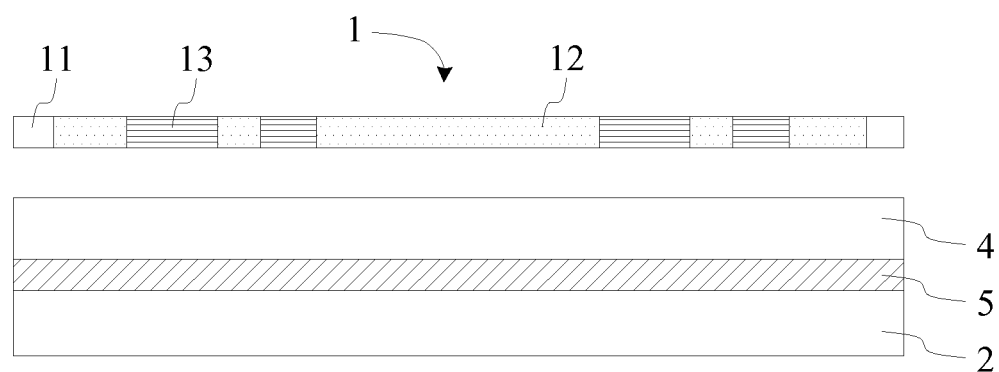
FIGS. 3a to 3d schematically show a process for manufacturing an array substrate as provided in Embodiment 3 of the present disclosure.

In step S23, as indicated in FIG. 3a, the photoresist layer 4 is exposed with a second illumination intensity through the mask plate 1 of Embodiment 1.

Specifically, the photoresist layer 4 is exposed with a relatively high second illumination intensity through the mask plate of Embodiment 1. In order to ensure complete removal of the photoresist layer 4 in the semi-transparent area 12 in subsequent step S24, the second illumination intensity should be at least a times the first illumination intensity, wherein a is the reciprocal of the transmittance of the semi-transparent area 12. For example, if the transmittance of the semi-transparent area 12 is ½, then the second illumination intensity should be at least twice the first illumination intensity. For another example, if the transmittance of the semi-transparent area 12 is ⅔, then the second illumination intensity should be at least 1.5 times the first illumination intensity.

Figure 3B:
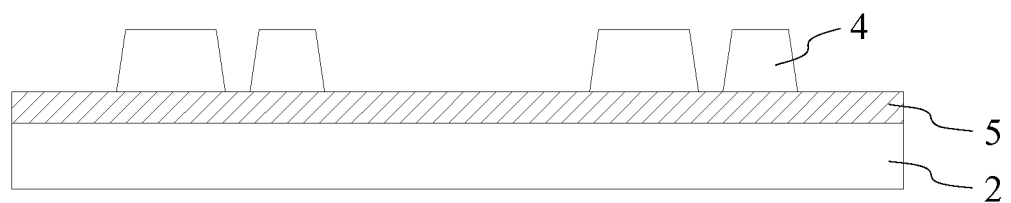

In step S24, as indicated in FIG. 3b, the photoresist layer 4 corresponding to the transparent area 11 and semi-transparent area 12 of the mask plate 1 is removed.

Specifically, an ashing process can be performed to remove the exposed photoresist layer 4. Since the photoresist layer 4 is exposed with the second illumination intensity in step S23 which is relatively high, it can be completely removed in the transparent area 11 and semi-transparent area 12, while the photoresist 4 in the non-transparent area 13 entirely remains.

Figure 3C:
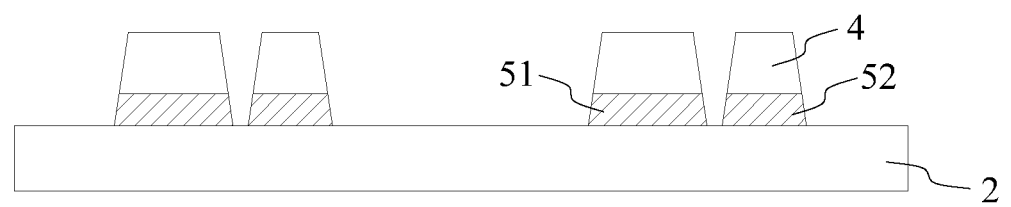

In step S25, as indicated in FIG. 3c, the gate metal layer 5 is etched to form a pattern of the gate metal layer.

Specifically, a wet etching process can be performed to the gate metal layer 5. Since the photoresist layer 4 in the transparent area 11 and the semi-transparent area 12 is completely removed, and only the photoresist layer 4 in the non-transparent area 13 remains, the gate metal layer 5 in the non-transparent area 13 (corresponding to the gate metal layer pattern) can remain after the etching process.

Figure 3D:
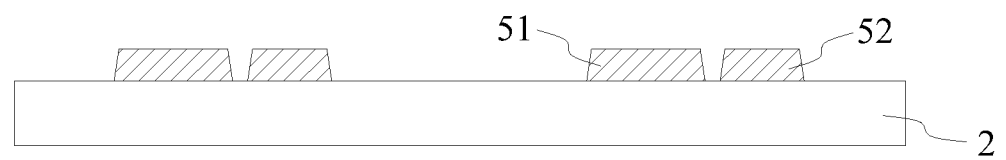

In step S26, as indicated in FIG. 3d, the remaining photoresist layer 4 is removed.

The photoresist layer 4 remaining in the non-transparent area 13 is removed by using a wet striping process, so that the gate metal layer pattern comprising a gate line 51 and a common electrode line 52 can be formed on the base substrate 2.

In addition, the process for manufacturing the array substrate further comprises subsequent procedures such as forming a gate insulator, an active layer, a source/drain metal layer pattern, a pixel electrode, and a passivation layer, each of which can be performed by using any conventional means. The subsequent procedures generally will not use the mask plate of Embodiment 1 and therefore will not be explained in detail here.

In other embodiments of the present disclosure, the non-transparent area of the mask plate can also correspond to other layer patterns of the array substrate. For example, the non-transparent area can correspond to the source/drain metal layer pattern of the array substrate, while the gate metal layer pattern and transparent electrode layer pattern of the liquid crystal display panel (the array substrate) are located in the semi-transparent area. In this case, the material layer to be etched in step S21 is a source/drain metal layer. Alternatively, the non-transparent area can also correspond to the transparent electrode layer pattern of the array substrate, while the gate metal layer pattern and source/drain metal layer pattern of the liquid crystal display panel (the array substrate) are located in the semi-transparent area. In this case, the material layer to be etched in step S21 is a transparent electrode layer.

The above embodiments prove that the mask plate of the present disclosure can be used to manufacture both an ultraviolet mask plate and an array substrate, thus achieving sharing of one mask plate in the manufacturing processes of the ultraviolet mask plate and the array substrate. As such, no separate mask plate is required for manufacture of the ultraviolet mask plate, thus reducing costs thereof.

Although the embodiments disclosed by the present disclosure are discussed above, the embodiments are provided for better understanding of the present disclosure rather than to limit the present disclosure. Anyone skilled in the art, without departing from the spirit or scope of the present disclosure, can make amendments or modification to the implementing forms and details of the embodiments. Regarding the scope of the present disclosure, however, the scope of the claims shall prevail.

The invention claimed is:

1. A mask plate, comprising a transparent area, a semi-transparent area, and a non-transparent area, wherein the transparent area and the non-transparent area correspond to a frame glue area and a layer pattern area of a liquid crystal display panel, respectively, and other regions of the mask plate constitute said semi-transparent area.

2. The mask plate of claim 1, wherein the transmittance of the semi-transparent area ranges from ½ to ⅔.

3. The mask plate of claim 1, wherein the layer pattern is in the form of a gate metal layer pattern, and a source/drain metal layer pattern and a transparent electrode layer pattern of said liquid crystal display panel are located in the semi-transparent area.

4. The mask plate of claim 1, wherein the layer pattern is in the form of a source/drain metal layer pattern, and a gate metal layer pattern and a transparent electrode layer pattern of said liquid crystal display panel are located in the semi-transparent area.

5. The mask plate of claim 1, wherein the layer pattern is in the form of a transparent electrode layer pattern, and a gate metal layer pattern and source/drain metal layer pattern of said liquid crystal display panel are located in said semi-transparent area.

6. A process for manufacturing an ultraviolet mask plate, comprising:
forming a metal layer on a base substrate;
coating a photoresist layer on the metal layer;
exposing said photoresist layer with a first illumination intensity through a mask plate, wherein the mask plate includes a transparent area, a semi-transparent area, and a non-transparent layer, the transparent area and non-transparent area corresponding to a frame glue area and a layer pattern area of a liquid crystal display panel, respectively, and other regions of the mask plate constituting said semi-transparent area;
removing the photoresist layer corresponding to the transparent area of the mask plate;
etching said metal layer; and
removing the remaining photoresist layer.

7. A process for manufacturing an array substrate, comprising:
forming a material layer to be etched on a base substrate;
coating a photoresist layer on the material to be etched;
exposing said photoresist layer with a second illumination intensity through a mask plate, wherein the mask plate includes a transparent area, a semi-transparent area, and a non-transparent layer, the transparent area and non-transparent area corresponding to a frame glue area and a layer pattern area of a liquid crystal display panel, respectively, and other regions of the mask plate constituting said semi-transparent area;
removing the photoresist layer corresponding to the transparent area and semi-transparent area of the mask plate;
etching said material to be etched to form a layer pattern; and
removing the remaining photoresist layer.

8. The process of claim 7, wherein the material layer to be etched is in the form of a metal layer, and the layer pattern is in the form of a gate metal layer pattern or a source/drain metal layer pattern.

9. The process of claim 7, wherein the material layer to be etched is in the form of a transparent electrode layer, and the layer pattern is in the form of a transparent electrode layer pattern.

* * * * *